United States Patent
Gilda et al.

(10) Patent No.: US 9,946,595 B2
(45) Date of Patent: Apr. 17, 2018

(54) REDUCING UNCORRECTABLE ERRORS BASED ON A HISTORY OF CORRECTABLE ERRORS

(71) Applicant: International Business Machines Corporation, Armonk, NY (US)

(72) Inventors: Glenn D. Gilda, Binghamton, NY (US); Patrick J. Meaney, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/870,347

(22) Filed: Sep. 30, 2015

(65) Prior Publication Data

US 2017/0091023 A1    Mar. 30, 2017

(51) Int. Cl.
*H03M 13/05* (2006.01)
*G06F 11/10* (2006.01)
(Continued)

(52) U.S. Cl.
CPC ........ *G06F 11/1068* (2013.01); *G06F 11/106* (2013.01); *G06F 11/1048* (2013.01); *G11C 29/44* (2013.01); *G11C 29/52* (2013.01)

(58) Field of Classification Search
None
See application file for complete search history.

(56) References Cited

U.S. PATENT DOCUMENTS

| 6,408,406 B1 * | 6/2002 | Parris | G11B 20/182 |
| | | | 714/41 |
| 6,560,725 B1 * | 5/2003 | Longwell | G06F 11/073 |
| | | | 711/105 |

(Continued)

OTHER PUBLICATIONS

Costa et al.; "A System Software Approach to Proactive Memory-Error Avoidance", IBM T. J. Watson Research Center, High Performance Computing, Networking, Storage and Analysis, SC14: IEEE International Conference On, Nov. 16-21, 2014, pp. 707-718.

(Continued)

*Primary Examiner* — Justin R Knapp
(74) *Attorney, Agent, or Firm* — Cantor Colburn LLP; William A. Kinnaman, Jr.

(57) ABSTRACT

In some embodiments, a computer-implemented method includes maintaining two or more error indicators for correctable errors occurring at two or more memory components. Each of the error indicators may be associated with a corresponding memory component. A correctable error may be detected as occurring during a first memory fetch operation at a first memory component. A first error indicator corresponding to the first memory component may be set, responsive to the correctable error at the first memory component. An uncorrectable error may be detected during a second memory fetch operation. It may be detected that the first error indicator is set. The first memory component may be marked, responsive to the uncorrectable error and to detecting that the first error indicator is set. The two or more error indicators for correctable errors may thus determine which memory component to mark due to the uncorrectable error.

18 Claims, 3 Drawing Sheets

(51) Int. Cl.
*G11C 29/52* (2006.01)
*G11C 29/44* (2006.01)

(56) References Cited

U.S. PATENT DOCUMENTS

| | | |
|---|---|---|
| 7,058,782 B2 | 6/2006 | Henderson et al. |
| 7,080,305 B2 | 7/2006 | Welbon et al. |
| 7,721,140 B2 | 5/2010 | Dell et al. |
| 7,870,441 B2 | 1/2011 | Gollub et al. |
| 8,423,875 B2 | 4/2013 | O'Neill et al. |
| 8,468,422 B2 | 6/2013 | Chessin et al. |
| 8,484,529 B2 | 7/2013 | Alves et al. |
| 8,631,310 B2 | 1/2014 | Yang |
| 8,793,544 B2 | 7/2014 | Johnson et al. |
| 8,843,806 B2 * | 9/2014 | Meaney ............. G06F 11/1004 714/6.12 |
| 8,990,643 B2 | 3/2015 | Gollub et al. |
| 9,032,264 B2 * | 5/2015 | Hashimoto ............. G11C 29/08 714/719 |
| 9,535,807 B2 * | 1/2017 | Prasad ................ G06F 12/0891 |
| 2014/0108889 A1 | 4/2014 | Shaeffer |
| 2014/0380096 A1 | 12/2014 | Dodson et al. |
| 2015/0019905 A1 | 1/2015 | Lastras et al. |
| 2015/0293822 A1 | 10/2015 | Chun et al. |
| 2015/0370712 A1 * | 12/2015 | Cheng ................... G06F 12/128 711/135 |
| 2016/0062821 A1 | 3/2016 | Yoon et al. |

OTHER PUBLICATIONS ip.com et al.; "Method for Update Bits to Improve Recoverability From Uncorrectable Errors for Last-Level Cache", IPCOM000143907D, Dec. 12, 2006, pp. 1-3.

Schroeder et al.; "DRAM Errors in The Wild: A Large-Scale Field Study", ACM SIGMETRICS/Performance'09 Proceedings of The 11th International Joint Conference on Measurement and Modeling of Computer Systems, vol. 37, Issue 1, Jun. 15-19, 2009, pp. 193-204.

\* cited by examiner

REDUCING UNCORRECTABLE ERRORS BASED ON A HISTORY OF CORRECTABLE ERRORS

BACKGROUND

Embodiments of the present invention relate to memory errors and, more specifically, to reducing uncorrectable errors based on a history of correctable errors.

During memory reads and writes, dynamic random access memories (DRAMs) experience occasional errors. These errors can be transient or permanent, also referred to respectively as soft or hard errors. These errors can result in both correctable and uncorrectable errors. In the case of a correctable error, the data read out of memory is restored to its correct value and is usable by the system, whereas in the case of an uncorrectable error, the data cannot be restored to its correct value and is unusable by the system. To manage errors and error correction, memory systems using DRAMs can include error correction circuitry (ECC), memory mirroring, redundant array of independent memory (RAIM) ECC, scrubbing, marking, sparing, and retries.

In the case of correctable errors, error information can be accumulated and used to make decisions to mark DRAM chips or memory channels, thus taking them offline to avoid future errors. This error information is often collected over time during memory scrub operations. Additionally, the error information is used to periodically update tables in hardware that control markings on DRAM chip and memory channels, to avoid future error events involving faulty DRAM chips or memory channels.

There may be circumstances, however, when either a DRAM chip or a memory channel experiences a burst of errors prior to a memory scrub discovering the errors. Depending on limitations in the ECC code, these bursts of errors may result in uncorrectable errors. Further, if there are simultaneous error events due to a burst of otherwise correctable errors in one channel combined with errors in another channel prior to a scrub setting a mark, uncorrectable errors are likely to result.

SUMMARY

According to an embodiment of this disclosure, a computer-implemented method includes maintaining two or more error indicators for correctable errors occurring at two or more memory components. Each of the two or more error indicators may be associated with a corresponding memory component of the two or more memory components. A correctable error may be detected as occurring during a first memory fetch operation at a first memory component of the two or more memory components. A first error indicator, of the two or more error indicators, corresponding to the first memory component may be set, responsive to the correctable error at the first memory component. An uncorrectable error may be detected during a second memory fetch operation. It may be detected that the first error indicator is set. The first memory component may be marked, responsive to the uncorrectable error and to detecting that the first error indicator is set. The two or more error indicators for correctable errors may thus determine which memory component to mark due to the uncorrectable error.

In another embodiment, a system includes a memory having computer readable instructions and one or more processors for executing the computer readable instructions. The computer readable instructions include maintaining two or more error indicators for correctable errors occurring at two or more memory components. Each of the two or more error indicators may be associated with a corresponding memory component of the two or more memory components. Further according to the computer readable instructions, a correctable error may be detected as occurring during a first memory fetch operation at a first memory component of the two or more memory components. A first error indicator, of the two or more error indicators, corresponding to the first memory component may be set, responsive to the correctable error at the first memory component. An uncorrectable error may be detected during a second memory fetch operation. It may be detected that the first error indicator is set. The first memory component may be marked, responsive to the uncorrectable error and to detecting that the first error indicator is set. The two or more error indicators for correctable errors may thus determine which memory component to mark due to the uncorrectable error.

In yet another embodiment, a computer program product for marking memory components includes a computer readable storage medium having program instructions embodied therewith. The program instructions are executable by a processor to cause the processor to perform a method. The method includes maintaining two or more error indicators for correctable errors occurring at two or more memory components. Each of the two or more error indicators may be associated with a corresponding memory component of the two or more memory components. Further according to the method, a correctable error may be detected as occurring during a first memory fetch operation at a first memory component of the two or more memory components. A first error indicator, of the two or more error indicators, corresponding to the first memory component may be set, responsive to the correctable error at the first memory component. An uncorrectable error may be detected during a second memory fetch operation. It may be detected that the first error indicator is set. The first memory component may be marked, responsive to the uncorrectable error and to detecting that the first error indicator is set. The two or more error indicators for correctable errors may thus determine which memory component to mark due to the uncorrectable error.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Various embodiments of this disclosure introduce a mechanism for reacting to, and potentially reducing, uncorrectable errors in memory based on a history of previous correctable errors. Counters may be used to track correctable errors as they occur during fetches of data from memory. In the event of an uncorrectable error, the information in these counters may be used to determine whether a mark should be placed to avoid future uncorrectable errors. As a result, some embodiments may avoid having to wait for a memory scrub to set marks, and may thus limit the number of uncorrectable errors that occur.

Figure 1:
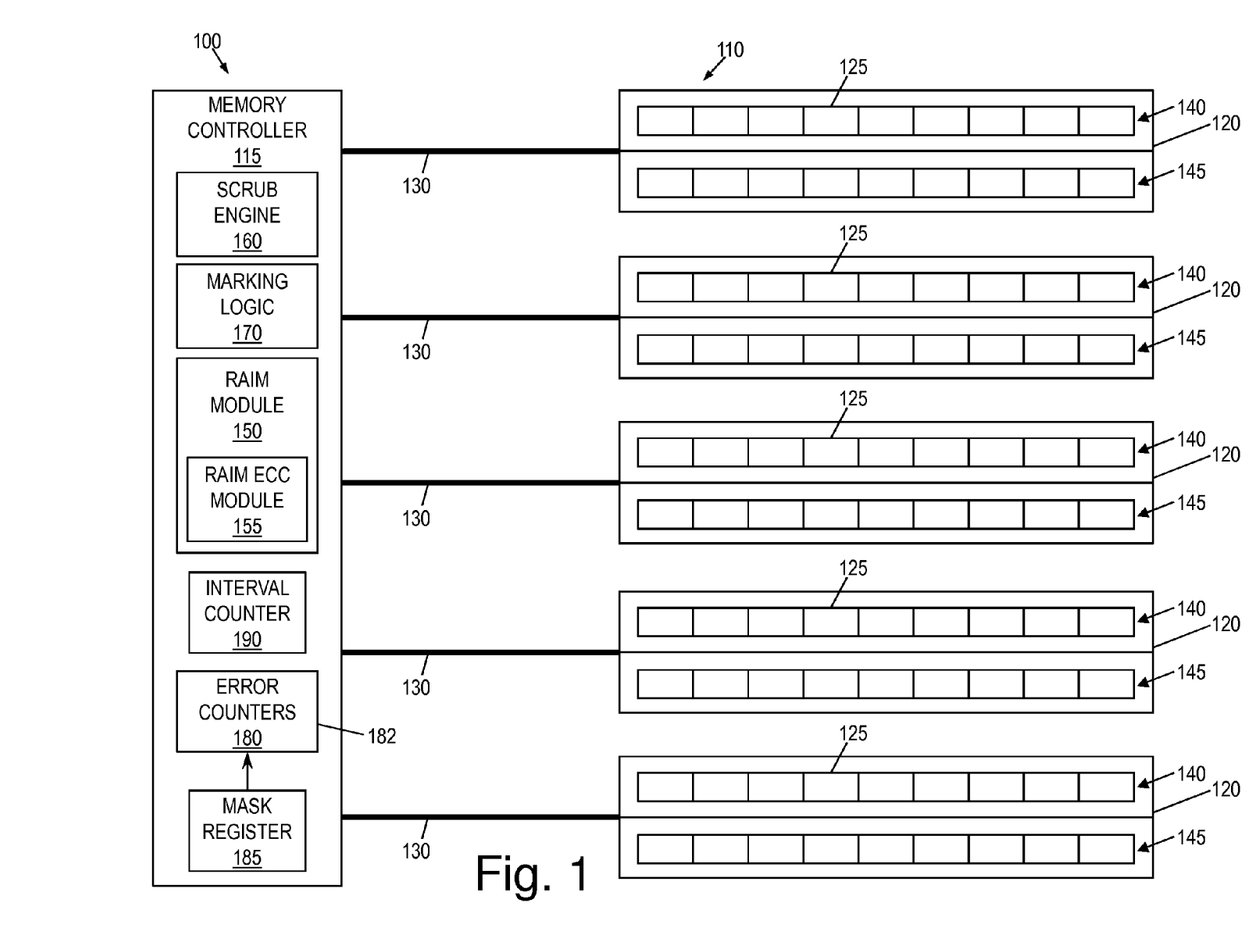
FIG. 1 is a block diagram of a marking system, for marking memory channels or other memory components, according to some embodiments of this disclosure.

FIG. 1 is a block diagram of a marking system 100, according to some embodiments of this disclosure. As shown, the marking system 100 may include or apply to a memory system 110, also referred to as herein as the memory 110, which may be a redundant array of independent memory (RAIM) system in some embodiments. The memory system 110 may include a memory controller 115 in communication with a plurality of memory modules 120, via memory channels 130 also referred to as memory interface buses. In some embodiments, the memory modules 120 may be dual inline memory modules (DIMMs), but the techniques disclosed herein are also applicable to other types of memory modules 120. Each memory module 120 may include one or more memory devices 125, also referred to as chips or dies.

The memory controller 115 may be configured to handle error correction within the memory modules 120. To perform error correction operations, the memory controller 115 may facilitate memory striping, scrubbing, and marking processes, for example. To this end, the memory controller 115 may include a RAIM module 150, a RAIM error correction circuitry (ECC) module 155, a scrub engine 160, and marking logic 170.

In some embodiments, the memory controller 115 logically aggregates the memory channels 130 so that the memory channels 130 operate in unison to support a single access request from the memory controller 115. Handling this access request may involve error detection and correction code that is distributed, or striped, across the memory channels 130 and associated memory devices 125. This distribution of error correction information may be performed by the RAIM module 150.

The memory devices 125 on a memory module 120 may be arranged in ranks 140, 145. In the example of FIG. 1, each rank 140, 145 includes nine memory devices 125 per memory module 120, and a total of forty-five memory devices 125 are striped across memory modules 120 for a given rank 140, 145. Of the forty-five memory devices 125 accessed per rank, for example, thirty-two may represent data, four may represent error correction code in the form of check bits, and nine may represent RAIM parity. It will be understood, however, that other arrangements may be within the scope of this disclosure.

As shown, the marking system 100 may include two or more error indicators 182, such as error counters 180, which may be controlled by the memory controller 115 in some embodiments. Each error counter 180 may be associated with a corresponding memory channel 130 of the memory system 110. In some embodiments, the error counters 180 are in communication with the marking logic 170, which may make determinations of whether and where to set marks, based at least in part on the values of the errors counters 180. It will be understood that error indicators 182 other than error counters 180 may be used in some embodiments, and thus, other error indicators 182 may be substituted for references to error counters 180 throughout this disclosure.

Generally, the marking system 100 may monitor errors occurring on the memory channels 130. In some embodiments, the number of error counters 180 may equal the number of memory channels 130 being monitored. In the example illustrated in FIG. 1, five memory channels 130 are monitored, and thus, five error counters 180 are used, with a distinct error counter 180 corresponding to each memory channel 130. In another example, however, the marking system 100 may monitor the memory system 110 at the chip level or at the rank, and thus one error counter 180 may be used for, respectively, each memory device 125 or rank 140, 145.

Thus, although this disclosure refers below to each error counter 180 being associated with a corresponding memory channel 130, one of skill in the art will understand that an error counter 180 may instead be associated with a memory device 125 or with a memory rank 140, 145, and that marks may be set accordingly per memory device 125 or per rank 140, 145. Further, in some embodiments, the error counters 180 may correspond to a combination of memory components, such as memory channels 130, memory devices 125, and ranks 140, 145, such that counting and marking occurs at various levels.

The error counters 180 may keep track of correctable errors. In some cases, when an error counter 180 has reached a threshold count, which may be a maximum value or other value of the error counter 180, a mark may be set on the corresponding memory channel 130, or memory device 125 or rank 140, 145. More generally, each error indicator 182 may be set or not set at a given time, and in the case of error counters 180, an error counter 180 may be deemed set when it has a value of at least the threshold count. Thus, in some cases, a mark may be set on a memory channel 130 when the corresponding error indicator 182 is set. However, in some embodiments, as discussed below, a mark is not set until an uncorrectable error is detected on a memory fetch. Additionally, as also discussed below, an interval counter 190 and a mask register 185 may further refine the marking system's use of the error counters 180 to avoid marks being set prematurely.

As shown, the marking logic 170, error counters 180, mask register 185, and interval counter 190 may be controlled by, or integrated with, the memory controller 115. In some embodiments, however, these components may be located elsewhere, such as on a buffer chip on a memory module 120.

Each error counter 180 may include a set of bits, the quantity of which may determine a maximum value of the error counter 180. For example, and not by way of limitation, an error counter 180 may be an 8-bit counter and may thus have a maximum value of 255. In some embodiments, the threshold count may be equal to this maximum value. Each error counter 180 may keep track of correctable errors identified on its corresponding memory channel 130 after the most recent reset of that error counter 180.

As in existing systems, the memory controller 115 may include error correction logic, which may be incorporated into the RAIM module 150. The memory controller 115 may perform fetches of data on the memory system 110 by way of the memory channels 130. With its error correction logic, the memory controller 115 may identify that an error occurred and may determine whether the error is correctable or uncorrectable. The memory controller 115 may further determine one or more portions of the memory system 110 that need correcting due to the error. Specifically, for example, the memory controller 115 may identify a correctable error and may specify at which memory channel 130 the correctable error occurred.

In some embodiments, each time the memory controller 115 identifies a correctable error related to a memory channel 130, the error counter 180 associated with that memory channel 130 increments. Thus, an error counter 180 may be incremented every time a memory fetch encounters a correctable error, and not only during memory scrubs. More generally, in some embodiments, an error indicator 182 may be set when a memory fetch encounters a correctable error. In the case of error counters 180, this setting may be deemed to occur when the threshold count is reached. When a memory scrub occurs, performed by the scrub engine 160, marks may be set by the marking logic 170 as per conventional techniques. Further, during a scrub, the error counters 180 may be cleared back to 0, and more generally, the error indicators 182 may be unset. Specifically, in some embodiments, this clearing may be performed by host firmware.

When an error counter 180 reaches its threshold count between scrubbings, this may be the result of a burst of correctable errors. The marking system 100 may thus detect a burst of correctable errors by identifying that an error counter 180 has reached its threshold count, or that an error indicator 182 has been otherwise set. When an error counter 180 reaches this threshold count, it may freeze at this value until reset, such as by the host firmware during scrubbing. The reaching of a threshold count, or more generally the setting of an error indicator 182, may provide a preliminary indication that it may be advantageous to mark that memory channel 130, and may make that memory channel 130 a candidate for marking. However, to avoid setting marks unnecessarily, the marking system 100 may wait until an uncorrectable error occurs.

Generally, setting a mark on a memory channel 130 is considered a last resort. In conventional systems, check bits used for correcting errors may be spread across the various memory channels 130. These check bits may include redundancies that enable error detection and correction. When these check bits can be used to correct a particular error, that error is deemed to be a correctable error. In contrast, uncorrectable errors are not able to be corrected by use of the check bits. When a memory channel 130 is marked, its check bits are no longer used, and thus, future errors may be more likely to be uncorrectable. Thus, marking a memory channel 130 may avoid future uncorrectable errors at the cost of limiting the ability to correct later errors on other memory modules 120 or memory channels 130. Some embodiments of the marking system 100 may therefore avoid marking memory channels 130, even after a burst of correctable errors, until an uncorrectable error occurs.

In some embodiments, the marking system 100 may recognize a burst of errors on a first memory channel 130 only if a threshold difference separates the value of the error counter 180 for the first memory channel 130 from the values of error counters 180 for other memory channels 130. In other words, in some embodiments, the marking system 100 may consider a series of errors on a first memory channel 130 to be a burst of errors, creating a candidate for marking, only if other memory channels 130 experienced a number of errors that is less than the number of errors on the first memory channel 130 by at least the threshold difference. In some embodiments, this threshold difference may be represented by a mask register 185, which may be assigned a value equal to the threshold difference. The bits set in the mask register 185 may therefore indicate which counter bits of error counters 180 for other memory channels 130 must remain off for the burst to be recognized. Specifically, for example, if the mask register 185 for 8-bit error counters 180 is set to a threshold difference of 11110000, then 15 correctable errors may be allowed on the other memory channels 130 for a burst to be recognized on the first memory channel 130. When an error counter 180 of another memory channel 130 exceeds 15, in this example, detection of a burst on the first memory channel 130 may be blocked.

Some embodiments of the marking system 100 may further include an interval counter 190, as shown in FIG. 1. The interval counter 190 may count fetches to the memory system 110 by incrementing each time a fetch operation is performed on the memory system 110, or may count time periods by incrementing for each time period of an established length that elapses. In some embodiments, the interval counter 190 may be implemented as a wrapping counter. Specifically, if the interval counter 190 has n bits, the interval counter 190 may wrap back to 0 after all n bits simultaneously have a value of 1. Some embodiments may implement an interval counter 190 that loads an initial interval value and counts down to a target value, such as a value of 0, and then reloads the initial interval value and restarts the countdown process, thereby supporting non-power of 2 intervals. When the interval counter 190 wraps back to 0, or reaches a threshold value or a target value, as appropriate to the implementation, this may be referred to as an overflow event. When an overflow event on the interval counter 190 occurs, the marking system 100 may decrement each of the error counters 180. This decrementing may be performed at each overflow event. However, in some embodiments, the error counters 180 cannot be decremented below a value of 0. It will be understood that some embodiments may use different intervals, other than fetches and time periods, as is deemed useful for determining when to remove accumulated error counts.

With use of the interval counter 190, older errors may be given less weight than more recent ones. For example, a correctable error that occurred prior to the last time the interval counter 190 wrapped may no longer be accounted for, due to a decrement triggered by an overflow event. Additionally, a burst of correctable errors may gradually be removed from the applicable error counter 180 as interval counter overflow events occur.

When an uncorrectable error is detected, the various error counters 180 may be checked to determine whether a burst of correctable errors occurred. More specifically, the error counters 180 may be checked to determine whether at least one error counter 180 is at the threshold count and, in some embodiments, whether the difference between that error counter 180 and all other error counters 180 is at least the threshold difference. More generally, in some embodiments, the error indicators 182 may be checked to determine whether one of them is set. A mark may be set based on an error counter 180 being at the threshold count, or based on an error indicator 182 being otherwise set. For example, if such an error counter 180 at the threshold count is identified, then a mark may be set on the memory channel 130 associated with that error counter 180. In some embodiments, the uncorrectable error may be the result of multiple errors occurring simultaneously or close together. Such errors may occur across multiple memory channels 130. In this case, for example, the memory channel 130 marked may correspond to an error counter 180 at the threshold count and may also be one of such memory channels 130 at which errors occurred, resulting in the uncorrectable error. In short, when an uncorrectable error occurs, the values of the various error counters 180 may provide a clue as to where a mark should be set, because the error counters 180 provide an indication as to which memory channels 130 may be contributing to uncorrectable errors.

Due to the mark, in some embodiments, future memory fetches may ignore data from the memory channel 130, or may take other action to account for the unreliability of the memory channel 130. Thus, in some embodiments, despite bursts of correctable errors that might have occurred, a mark is set only when an uncorrectable error occurs. As a result, correctable errors may behave as warnings of potential issues, which may be confirmed with the appearance of an uncorrectable error.

In some embodiments, if the uncorrectable error was produced by two or more simultaneous errors, and if a first of those simultaneous errors was due to the now-marked memory channel 130, then the second of those simultaneous errors might now be correctable. If that is the case, then the second of those errors may be corrected. Additionally, due to the marking, future uncorrectable errors may be avoided.

In some embodiments, the marking system 100 may prevent marks from being set on more than a predetermined number of memory channels 130, for example, on more than a single memory channel 130. This may be useful to ensure that a minimum number of memory channels 130 remain online for delivering data from the memory system 110. To this end, for example, the marking system 100 may set no further marks until notified by the host firmware that one or more existing marks have been removed. For another example, the host firmware may block the marking system 100, or set the marking system 100 to inactive, until one or more existing marks are removed.

Figure 2:
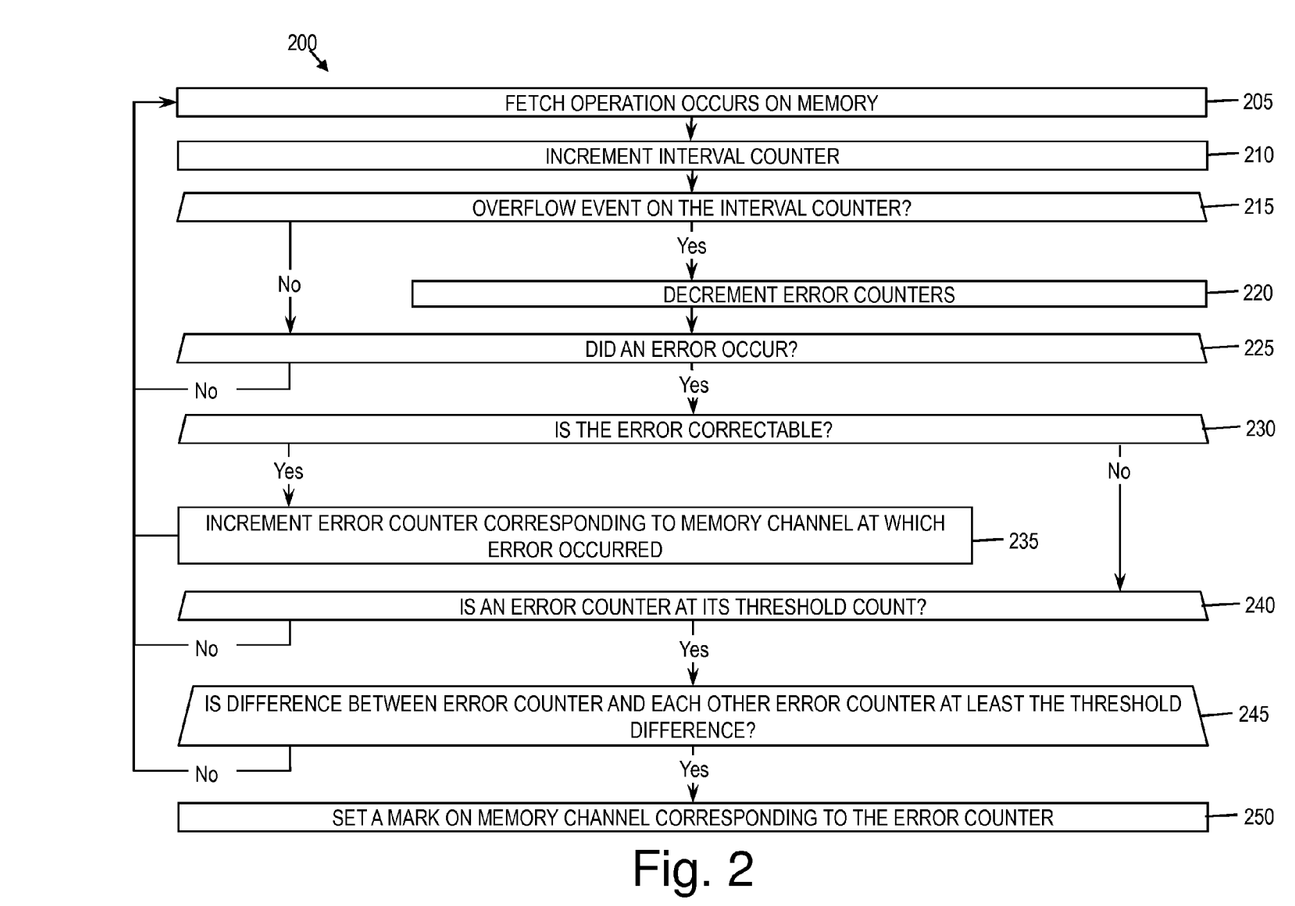
FIG. 2 is a flow diagram of a method for marking memory channels, according to some embodiments of this disclosure.

FIG. 2 is a flow diagram of a method 200 for marking a memory channel 130, according to some embodiments of this disclosure. As shown, at block 205, a fetch operation occurs on memory. At block 210, as a result of the fetch, the interval counter 190 may be incremented. At decision block 215, it may be determined whether the incrementing caused an overflow event on the interval counter 190. If so, then at block 220, the error counters 180 may each be decremented. Regardless of whether an overflow event occurred, at decision block 225, it may be determined whether an error occurred on the fetch. If no error occurred, then the method 200 may return to block 205. If an error occurred, then at decision block 230, it may be determined whether the error is correctable. If the error is correctable, then at block 235, the error counter 180 for the memory channel 130 at which the error was encountered may be incremented, and the method 200 may return to block 205. If the error is uncorrectable, then at decision block 240, it may be determined whether an error counter 180 is at the threshold count. If an identified error counter 180 is at the threshold count, then at decision block 245, it may be determined whether the difference between the identified error counter and each other error counters 180 is at least the threshold difference. If the error counter 180 is not yet at the threshold count, or if at least one other error counter 180 has a value that is within the threshold difference of the identified error counter 180, then the method 200 may return to block 205. Otherwise, at block 250, a mark may be set on the memory channel 130 corresponding to the identified error counter 180 at the threshold count.

Figure 3:
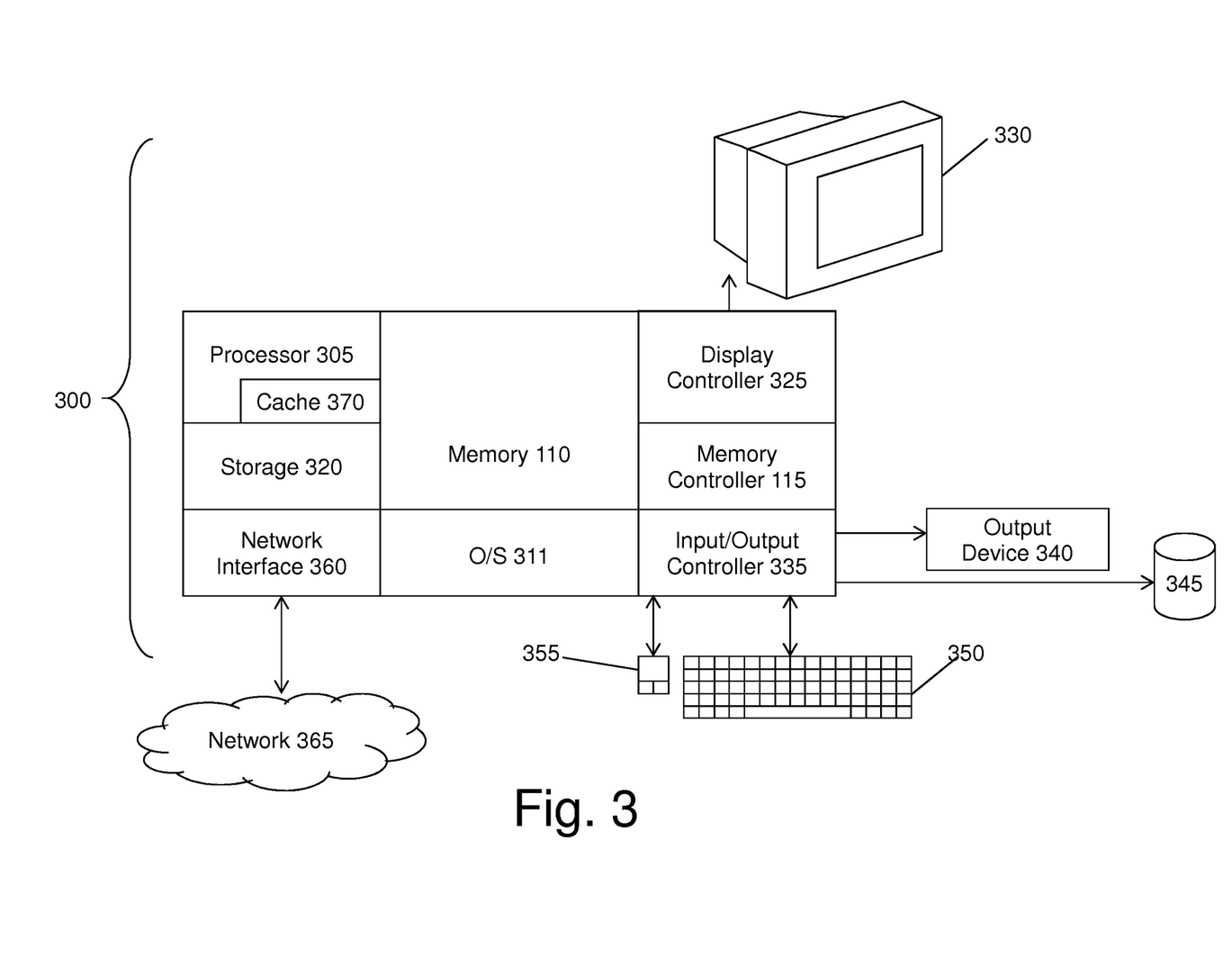
FIG. 3 is a block diagram of a computer system for implementing some or all aspects of the marking system, according to some embodiments of this disclosure.

FIG. 3 illustrates a block diagram of a computer system 300 for use in implementing a marking system or method according to some embodiments. The marking systems and methods described herein may be implemented in hardware, software (e.g., firmware), or a combination thereof. In some embodiments, the methods described may be implemented, at least in part, in hardware and may be part of the microprocessor of a special or general-purpose computer system 300, such as a personal computer, workstation, minicomputer, or mainframe computer.

In some embodiments, as shown in FIG. 3, the computer system 300 includes a processor 305, memory 110 coupled to a memory controller 115, and one or more input devices 345 and/or output devices 340, such as peripherals, that are communicatively coupled via a local I/O controller 335. These devices 340 and 345 may include, for example, a printer, a scanner, a microphone, and the like. Input devices such as a conventional keyboard 350 and mouse 355 may be coupled to the I/O controller 335. The I/O controller 335 may be, for example, one or more buses or other wired or wireless connections, as are known in the art. The I/O controller 335 may have additional elements, which are omitted for simplicity, such as controllers, buffers (caches), drivers, repeaters, and receivers, to enable communications.

The I/O devices 340, 345 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 305 is a hardware device for executing hardware instructions or software, particularly those stored in memory 110. The processor 305 may be a custom made or commercially available processor, a central processing unit (CPU), an auxiliary processor among several processors associated with the computer system 300, a semiconductor based microprocessor (in the form of a microchip or chip set), a macroprocessor, or other device for executing instructions. The processor 305 includes a cache 370, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 370 may be organized as a hierarchy of more cache levels (L1, L2, etc.).

The memory 110 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). In the case of DRAM or other memory supporting error-correction and marking, as discussed above, the marking system 100 may be used to reduce uncorrectable errors. Moreover, the memory 110 may incorporate electronic, magnetic, optical, or other types of storage media. Note that the memory 110 may have a distributed architecture, where various components are situated remote from one another but may be accessed by the processor 305.

The instructions in memory 110 may include one or more separate programs, each of which comprises an ordered listing of executable instructions for implementing logical functions. In the example of FIG. 3, the instructions in the memory 110 include a suitable operating system (OS) 311. The operating system 311 essentially may control the execution of other computer programs and provides scheduling, input-output control, file and data management, memory management, and communication control and related services.

Additional data, including, for example, instructions for the processor 305 or other retrievable information, may be stored in storage 320, which may be a storage device such as a hard disk drive or solid state drive. The stored instructions in memory 110 or in storage 320 may include those enabling the processor to execute one or more aspects of the marking systems and methods of this disclosure.

The computer system 300 may further include a display controller 325 coupled to a display 330. In some embodiments, the computer system 300 may further include a network interface 360 for coupling to a network 365. The network 365 may be an IP-based network for communication between the computer system 300 and an external server, client and the like via a broadband connection. The network 365 transmits and receives data between the computer system 300 and external systems. In some embodiments, the network 365 may be a managed IP network administered by a service provider. The network 365 may be implemented in a wireless fashion, e.g., using wireless protocols and technologies, such as WiFi, WiMax, etc. The network 365 may also be a packet-switched network such as a local area network, wide area network, metropolitan area network, the Internet, or other similar type of network environment. The network 365 may be a fixed wireless network, a wireless local area network (LAN), a wireless wide area network (WAN) a personal area network (PAN), a virtual private network (VPN), intranet or other suitable network system and may include equipment for receiving and transmitting signals.

Marking systems and methods according to this disclosure may be embodied, in whole or in part, in computer program products or in computer systems 300, such as that illustrated in FIG. 3.

Technical effects and benefits of some embodiments include the ability to reduce uncorrectable errors based on the detection and counting of correctable errors. In some embodiments, the marking system 100 may take into consideration various factors related to fetches and correctable errors, so as to decide when to set marks in a manner that reduces uncorrectable errors while limiting negative impact on error correction capabilities, and without having to wait for memory scrubs to occur.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
maintaining two or more error counters for correctable errors occurring at two or more memory components, wherein each of the two or more error counters is associated with a corresponding memory component of the two or more memory components;
detecting a correctable error occurring during a first memory fetch operation at a first memory component of the two or more memory components;
incrementing a first error counter to a value that is at least a threshold count, wherein the first error counter is among the two or more error counters and corresponds to the first memory component, responsive to the correctable error at the first memory component;
detecting an uncorrectable error during a second memory fetch operation;
detecting that the first error counter has a value of at least the threshold count; and
marking the first memory component, responsive to the uncorrectable error and further responsive to detecting that the first error counter has a value of at least the threshold count, wherein a value of each error counter of the two or more error counters for correctable errors determines whether to mark the corresponding memory component due to the uncorrectable error.

2. The method of claim 1, further comprising:
incrementing an interval counter responsive to at least one of each memory fetch operation and each elapsed time interval; and
decrementing each of the two or more error counters when an overflow event occurs on the interval counter.

3. The method of claim 1, further comprising:
determining that each of the two or more error counters other than the first error counter has a value that differs from the first error counter by at least a threshold difference;
wherein marking the first memory component is further responsive to determining that each of the two or more error counters other than the first error counter has a value that differs from the first error counter by at least a threshold difference.

4. The method of claim 1, wherein marking the first memory component occurs outside of a memory scrub.

5. The method of claim 1, wherein at least one of the two or more memory components is a memory channel in a redundant array of independent memory system.

6. The method of claim 5, wherein at least one of the two or more memory components is at least one of a memory chip and a memory rank.

7. A system comprising:
a memory having computer readable instructions; and
one or more processors for executing the computer readable instructions, the computer readable instructions comprising:
maintaining two or more error counters for correctable errors occurring at two or more memory components, wherein each of the two or more error counters is associated with a corresponding memory component of the two or more memory components;

detecting a correctable error occurring during a first memory fetch operation at a first memory component of the two or more memory components;

incrementing a first error counter to a value that is at least a threshold count, wherein the first error counter is among the two or more error counters and corresponds to the first memory component, responsive to the correctable error at the first memory component;

detecting an uncorrectable error during a second memory fetch operation;

detecting that the first error counter has a value of at least the threshold count; and marking the first memory component, responsive to the uncorrectable error and further responsive to detecting that the first error counter has a value of at least the threshold count, wherein a value of each error counter of the two or more error counters for correctable errors determines whether to mark the corresponding memory component due to the uncorrectable error.

8. The system of claim 7, the computer readable instructions further comprising:

incrementing an interval counter responsive to at least one of each memory fetch operation and each elapsed time interval; and decrementing each of the two or more error counters when an overflow event occurs on the interval counter.

9. The system of claim 7, the computer readable instructions further comprising:

determining that each of the two or more error counters other than the first error counter has a value that differs from the first error counter by at least a threshold difference;

wherein marking the first memory component is further responsive to determining that each of the two or more error counters other than the first error counter has a value that differs from the first error counter by at least a threshold difference.

10. The system of claim 7, wherein marking the first memory component occurs outside of a memory scrub.

11. The system of claim 7, wherein at least one of the two or more memory components is a memory channel in a redundant array of independent memory system.

12. The system of claim 11, wherein at least one of the two or more memory components is at least one of a memory chip and a memory rank.

13. A computer program product for marking memory components, the computer program product comprising a computer readable storage medium having program instructions embodied therewith, the program instructions executable by a processor to cause the processor to perform a method comprising:

maintaining two or more error counters for correctable errors occurring at two or more memory components, wherein each of the two or more error counters is associated with a corresponding memory component of the two or more memory components;

detecting a correctable error occurring during a first memory fetch operation at a first memory component of the two or more memory components;

incrementing a first error counter to a value that is at least a threshold count, wherein the first error counter is among the two or more error counters and corresponds to the first memory component, responsive to the correctable error at the first memory component;

detecting an uncorrectable error during a second memory fetch operation;

detecting that the first error counter has a value of at least the threshold count; and marking the first memory component, responsive to the uncorrectable error and further responsive to detecting that the first error counter has a value of at least the threshold count, wherein a value of each error counter of the two or more error counters for correctable errors determines whether to mark the corresponding memory component due to the uncorrectable error.

14. The computer program product of claim 13, the method further comprising:

incrementing an interval counter responsive to at least one of each memory fetch operation and each elapsed time interval; and decrementing each of the two or more error counters when an overflow event occurs on the interval counter.

15. The computer program product of claim 13, the method further comprising:

determining that each of the two or more error counters other than the first error counter has a value that differs from the first error counter by at least a threshold difference;

wherein marking the first memory component is further responsive to determining that each of the two or more error counters other than the first error counter has a value that differs from the first error counter by at least a threshold difference.

16. The computer program product of claim 13, wherein marking the first memory component occurs outside of a memory scrub.

17. The computer program product of claim 13, wherein at least one of the two or more memory components is at least one of a memory channel in a redundant array of independent memory system.

18. The computer program product of claim 17, wherein at least one of the two or more memory components is at least one of a memory chip and a memory rank.

* * * * *